United States Patent
Ho et al.

(10) Patent No.: US 9,379,217 B2
(45) Date of Patent: Jun. 28, 2016

(54) FINFETS AND THE METHODS FOR FORMING THE SAME

(71) Applicant: Taiwan Semiconductor Manufacturing Company, Ltd., Hsin-Chu (TW)

(72) Inventors: Chia-Cheng Ho, Hsin-Chu (TW); Tzu-Chiang Chen, Hsin-Chu (TW); Yi-Tang Lin, Hsin-Chu (TW); Chih-Sheng Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/258,615

(22) Filed: Apr. 22, 2014

(65) Prior Publication Data

US 2014/0239414 A1    Aug. 28, 2014

Related U.S. Application Data

(62) Division of application No. 13/346,445, filed on Jan. 9, 2012, now Pat. No. 8,759,184.

(51) Int. Cl.
| | |
|---|---|
| *H01L 29/76* | (2006.01) |
| *H01L 21/336* | (2006.01) |
| *H01L 29/66* | (2006.01) |
| *H01L 29/78* | (2006.01) |
| *H01L 29/06* | (2006.01) |

(52) U.S. Cl.
CPC ........ *H01L 29/66795* (2013.01); *H01L 29/785* (2013.01); *H01L 29/0673* (2013.01)

(58) Field of Classification Search
CPC ..................................................... H01L 29/785

USPC ........................................................ 257/401
See application file for complete search history.

(56) References Cited

U.S. PATENT DOCUMENTS

| | | |
|---|---|---|
| 6,709,982 B1 | 3/2004 | Buynoski et al. |
| 6,858,478 B2 | 2/2005 | Chau et al. |
| 6,921,963 B2 | 7/2005 | Krivokapic et al. |
| 7,060,539 B2 | 6/2006 | Chidambarrao et al. |
| 7,129,550 B2 | 10/2006 | Fujiwara et al. |
| 7,300,837 B2 | 11/2007 | Chen et al. |
| 7,470,951 B2 | 12/2008 | Mathew et al. |

(Continued)

FOREIGN PATENT DOCUMENTS

| | | |
|---|---|---|
| JP | 2005051241 A | 2/2005 |
| JP | 2011103450 A | 5/2011 |

(Continued)

*Primary Examiner* — Moazzam Hossain
(74) *Attorney, Agent, or Firm* — Slater Matsil, LLP

(57) ABSTRACT

A method includes providing a plurality of semiconductor fins parallel to each other, and includes two edge fins and a center fin between the two edge fins. A middle portion of each of the two edge fins is etched, and the center fin is not etched. A gate dielectric is formed on a top surface and sidewalls of the center fin. A gate electrode is formed over the gate dielectric. The end portions of the two edge fins and end portions of the center fin are recessed. An epitaxy is performed to form an epitaxy region, wherein an epitaxy material grown from spaces left by the end portions of the two edge fins are merged with an epitaxy material grown from a space left by the end portions of the center fin to form the epitaxy region. A source/drain region is formed in the epitaxy region.

19 Claims, 20 Drawing Sheets

(56) References Cited

U.S. PATENT DOCUMENTS

| | | |
|---|---|---|
| 7,554,165 B2 | 6/2009 | Hokazono |
| 7,692,254 B2 | 4/2010 | Anderson et al. |
| 7,851,865 B2 | 12/2010 | Anderson et al. |
| 7,872,303 B2 | 1/2011 | Chan et al. |
| 7,919,816 B2 | 4/2011 | Gossner et al. |
| 7,927,938 B2 | 4/2011 | El-Kareh et al. |
| 7,989,856 B2 * | 8/2011 | Goto .................. H01L 29/7845 257/288 |
| 8,030,736 B2 | 10/2011 | Booth, Jr. et al. |
| 8,207,038 B2 | 6/2012 | Cheng et al. |
| 8,263,451 B2 | 9/2012 | Su et al. |
| 8,264,021 B2 * | 9/2012 | Lai .................... H01L 29/41791 257/288 |
| 8,354,311 B2 | 1/2013 | Forbes |
| 8,362,568 B2 | 1/2013 | Lin et al. |
| 8,367,498 B2 | 2/2013 | Chang et al. |
| 8,394,684 B2 | 3/2013 | Kanakasabapathy et al. |
| 8,399,938 B2 | 3/2013 | Cheng et al. |
| 2005/0093154 A1 | 5/2005 | Kottantharayil et al. |
| 2005/0242395 A1 | 11/2005 | Chen et al. |
| 2006/0166456 A1 | 7/2006 | Fujiwara et al. |
| 2007/0221956 A1* | 9/2007 | Inaba ............................ 257/197 |
| 2008/0096355 A1* | 4/2008 | Jang et al. ..................... 438/283 |
| 2008/0315309 A1* | 12/2008 | Chang et al. .................. 257/346 |
| 2009/0020819 A1 | 1/2009 | Anderson et al. |
| 2009/0127592 A1 | 5/2009 | El-Kareh et al. |
| 2009/0315112 A1 | 12/2009 | Lee |
| 2010/0025767 A1* | 2/2010 | Inaba ............................ 257/365 |
| 2010/0052059 A1 | 3/2010 | Lee |
| 2010/0133614 A1* | 6/2010 | Beyer ................ H01L 29/41791 257/347 |
| 2011/0068407 A1 | 3/2011 | Yeh et al. |
| 2011/0073952 A1 | 3/2011 | Kwok et al. |
| 2011/0079829 A1* | 4/2011 | Lai .................... H01L 29/41791 257/288 |
| 2011/0095378 A1 | 4/2011 | Lee et al. |
| 2011/0101455 A1 | 5/2011 | Basker et al. |
| 2011/0133292 A1 | 6/2011 | Lee et al. |
| 2011/0147812 A1 | 6/2011 | Steigerwald et al. |
| 2012/0070947 A1* | 3/2012 | Basker ............. H01L 29/66795 438/197 |
| 2012/0091528 A1 | 4/2012 | Chang et al. |
| 2012/0104472 A1 | 5/2012 | Xu et al. |
| 2013/0052801 A1 | 2/2013 | Berliner et al. |
| 2013/0056827 A1 | 3/2013 | Tsai et al. |
| 2013/0175584 A1 | 7/2013 | Ho et al. |
| 2013/0175638 A1 | 7/2013 | Ho et al. |
| 2013/0228836 A1* | 9/2013 | Tsai et al. ..................... 257/288 |

FOREIGN PATENT DOCUMENTS

| | | |
|---|---|---|
| KR | 20060027640 A | 3/2006 |
| KR | 101051180 | 7/2006 |
| KR | 20060079329 A | 7/2006 |
| KR | 100857087 B1 | 9/2008 |
| KR | 20110033033 A | 3/2011 |
| KR | 20110065326 A | 6/2011 |

\* cited by examiner

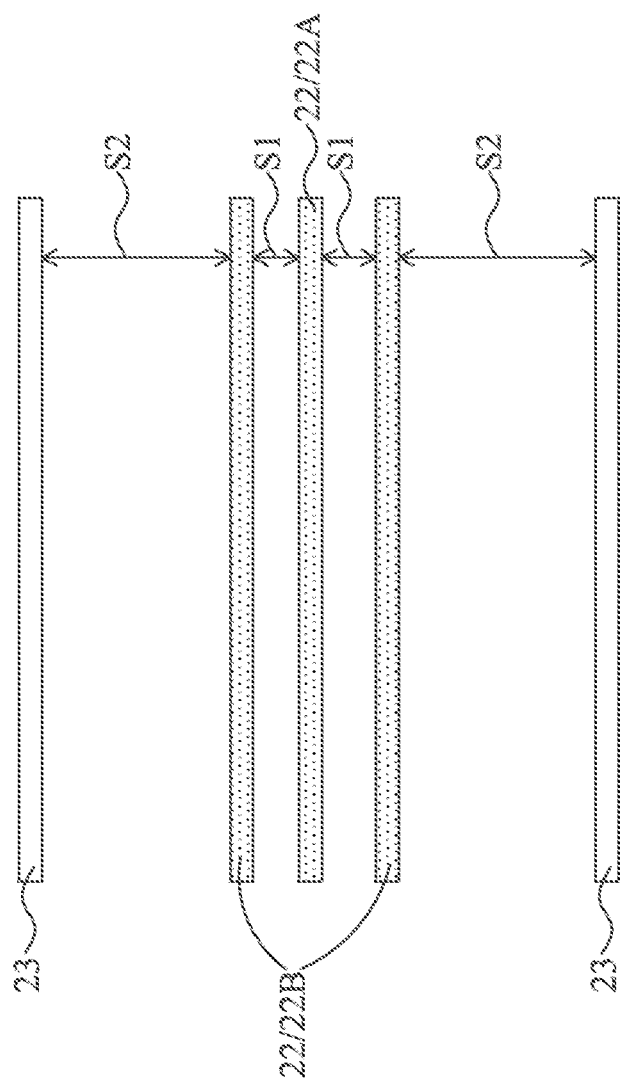

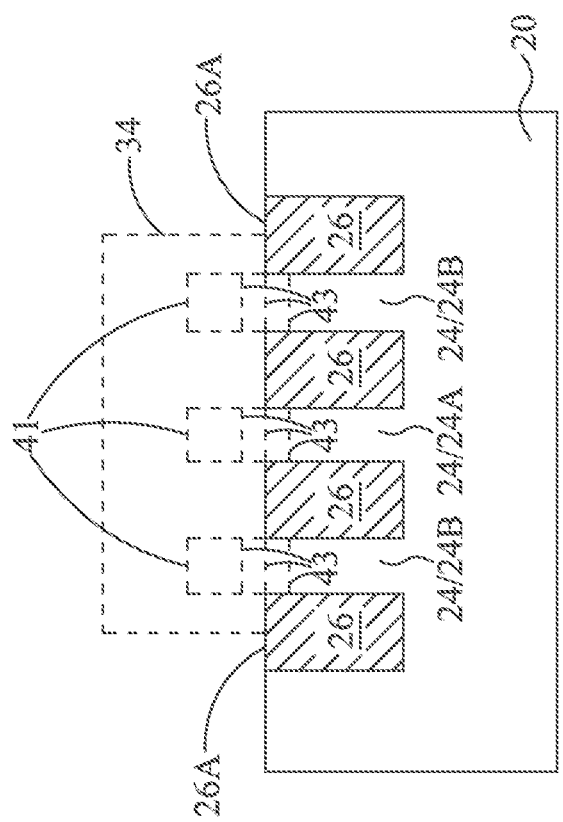

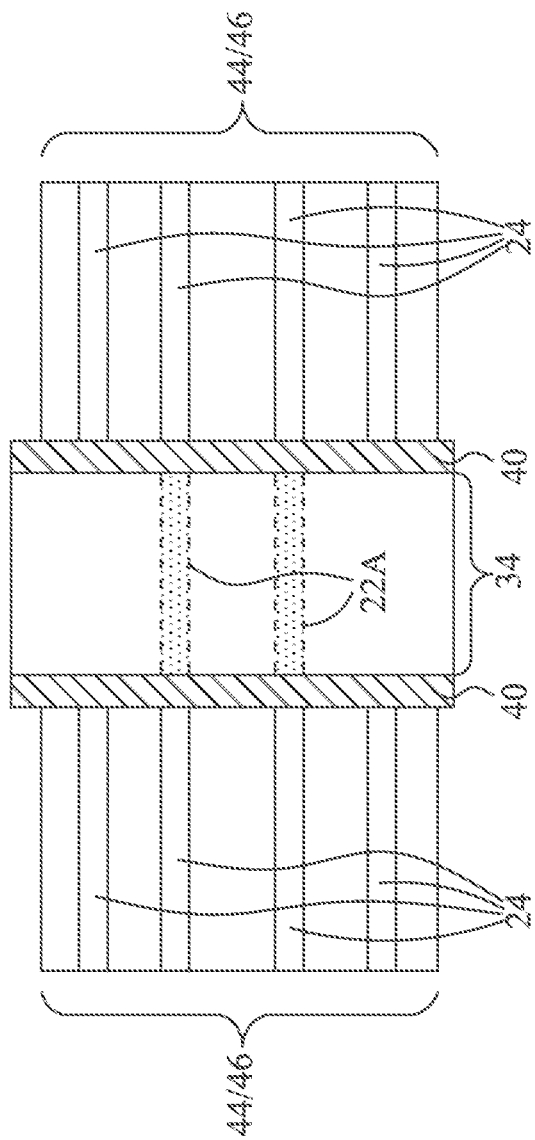

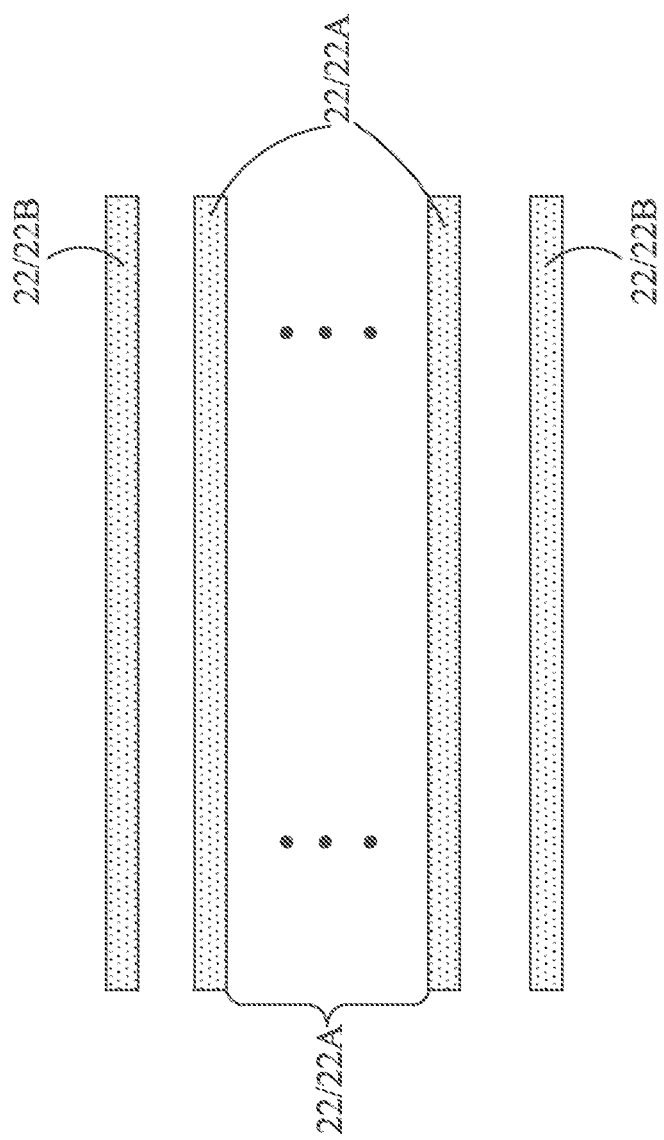

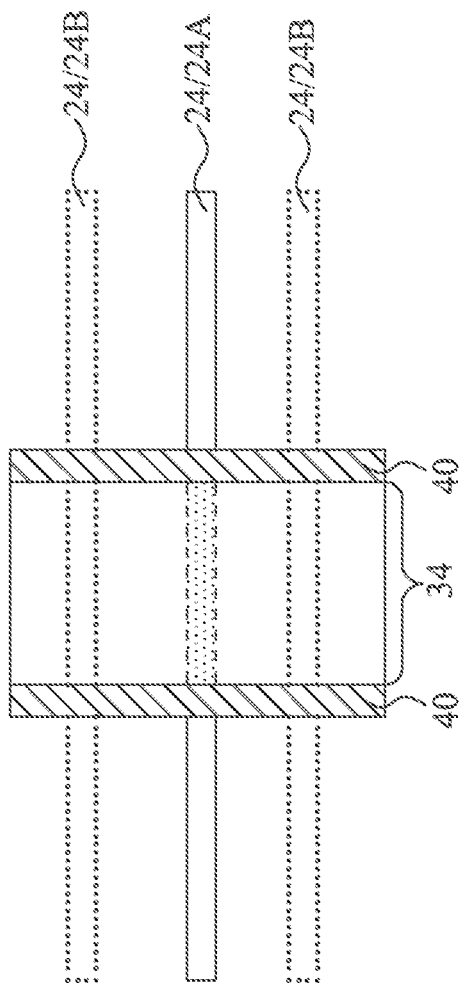

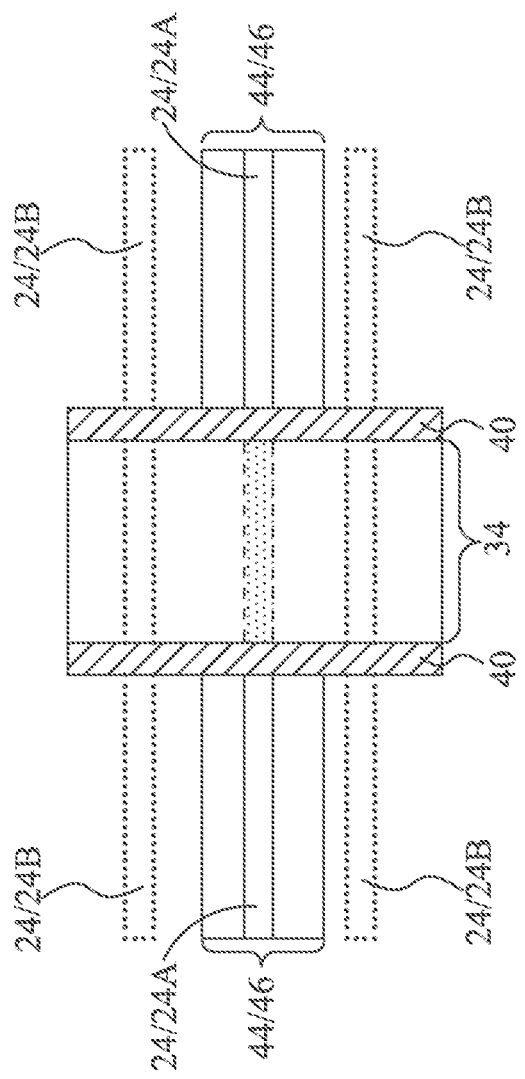

FINFETS AND THE METHODS FOR FORMING THE SAME

PRIORITY CLAIM AND CROSS-REFERENCE

This application is a divisional of, and claims priority to, U.S. patent application Ser. No. 13/346,445, filed on Jan. 9, 2012 and entitled "FinFETs and the Methods for Forming the Same" which application is incorporated herein by reference.

This application relates to the commonly-assigned U.S. patent application Ser. No. 13/346,411, filed on Jan. 9, 2012, now U.S. Pat. No. 8,609,499, granted Dec. 17, 2013, and entitled "FinFETs and the Methods for Forming the Same," and commonly-assigned U.S. patent application Ser. No. 13/914,362, filed on Jun. 10, 2013 and entitled "FinFETs and the Methods for Forming the Same," a divisional of commonly assigned U.S. Pat. No. 8,609,499, on filed on Jan. 9, 2012 and entitled "FinFETs and the Methods for Forming the Same," which applications are hereby incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFET) were thus developed. FinFET transistors have increased channel widths. The increase in the channel width is achieved by forming channels that include portions on the sidewalls of the fins and portions on the top surfaces of the fins. A FinFET may be a double-gate FET, which includes channels on the sidewalls of the respective fin, but no channel on the top surface of the respective fin. A FinFET may also be a triple-gate FET, which includes channels on the sidewalls and the top surface of the respective fin. Since the drive currents of transistors are proportional to the channel widths, the drive currents of the FinFETs are increased.

BRIEF DESCRIPTION OF THE DRAWINGS

A For a more complete understanding of the embodiments, and the advantages thereof, reference is now made to the following descriptions taken in conjunction with the accompanying drawings, in which:

FIGS. 1A through 5B are cross-sectional views, top views, and perspective views of intermediate stages in the manufacturing of a Fin Field-Effect Transistor (FinFET) in accordance with some exemplary embodiments;

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Fin Field-Effect Transistor (FinFET) and the methods of forming the same are provided in accordance with various embodiments. The intermediate stages of forming the Fin-FET are illustrated. The variations of the FinFET in accordance with embodiments are discussed. Throughout the various views and illustrative embodiments, like reference numbers are used to designate like elements.

Figure 1B:
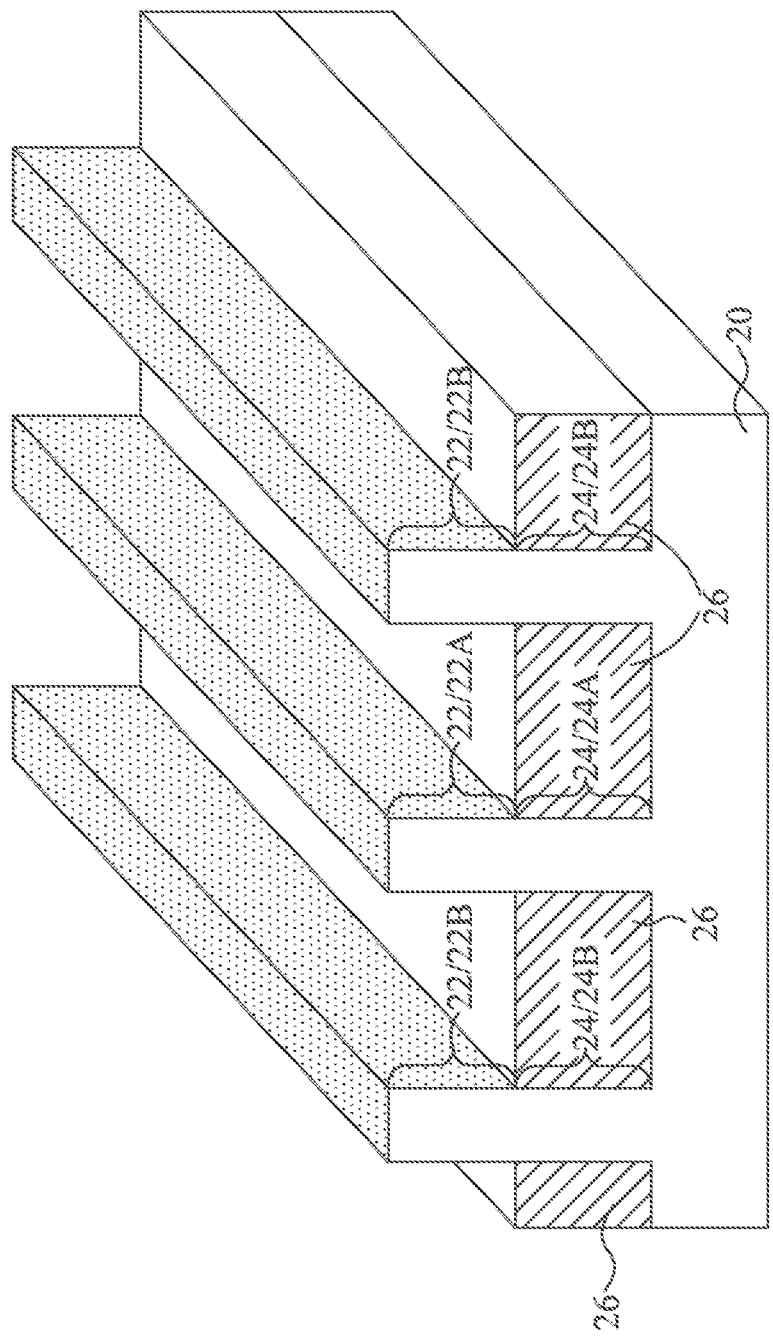

FIGS. 1A through 5B are cross-sectional views, top views, and perspective views of intermediate stages in the manufacturing of a FinFET in accordance with some exemplary embodiments. FIGS. 1A and 1B illustrate a top view and a perspective view, respectively, of a structure. Referring to FIG. 1A, a plurality of semiconductor fins 22 is formed. Semiconductor fins 22 may be parallel to each other. Also, the respective ends of semiconductor fins 22 may be aligned to each other. In some embodiments, semiconductor fins 22 have a uniform spacing, and spacings S1 between neighboring semiconductor fins 22 may be equal to each other. In alternative embodiments, spacings S1 between neighboring semiconductor fins 22 may be different from to each other.

FIG. 1B illustrates a perspective view of a portion of the structure shown in FIG. 1A. The structure includes substrate 20. Substrate 20 may be a semiconductor substrate, which may further be a silicon substrate, a germanium substrate, or a substrate formed of other semiconductor materials. Substrate 20 may be doped with a p-type or an n-type impurity. Isolation regions such as Shallow Trench Isolation (STI) regions 26 may be formed in substrate 20. The portions of substrate 20 between neighboring STI regions 26 form semiconductor strips 24. The top surfaces of semiconductor strips 24 and the top surfaces of STI regions 26 are substantially level with each other. In some exemplary embodiments, the edges of semiconductor fins 22 are vertically aligned to the respective edges of the corresponding semiconductor strips 24, and are aligned to the edges of STI regions 26. Semiconductor fins 22 and semiconductor strips 24 may be formed of a same semiconductor material.

Figure 2A:
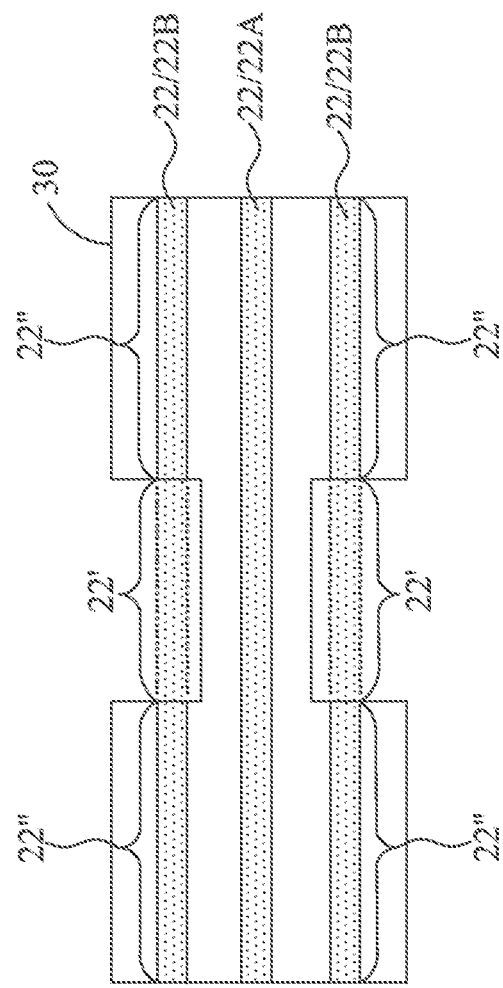

Referring to FIG. 2A, a patterning is performed to etch the middle portions of some of semiconductor fins 22, while some other portions of semiconductor fins 22 are not etched. FIG. 2A is a top view. Throughout the description, the un-etched semiconductor fins 22 are referred to as semiconductor fins 22A, and the etched semiconductor fins 22 are referred to as semiconductor fins 22B. Similarly, semiconductor strips 24 that are underlying and aligned to semiconductor fins 22A are referred to as semiconductor strips 24A, and semiconductor strips 24 that are underlying and aligned to semiconductor fins 22B are referred to as semiconductor strips 24B. To perform the etching step, an etching mask, such as photo resist 30, may be formed and patterned. Photo resist 30 covers entireties of semiconductor fins 22A and the end portions of semiconductor fins 22B. The middle portions of semiconductor fins 22B are not covered by photo resist 30. Using photo resist 30 as the etching mask, the middle portions 22' of semiconductor fins 22B are removed, and opposite end portions 22" of semiconductor fins 22B remain not etched.

Figure 2B:
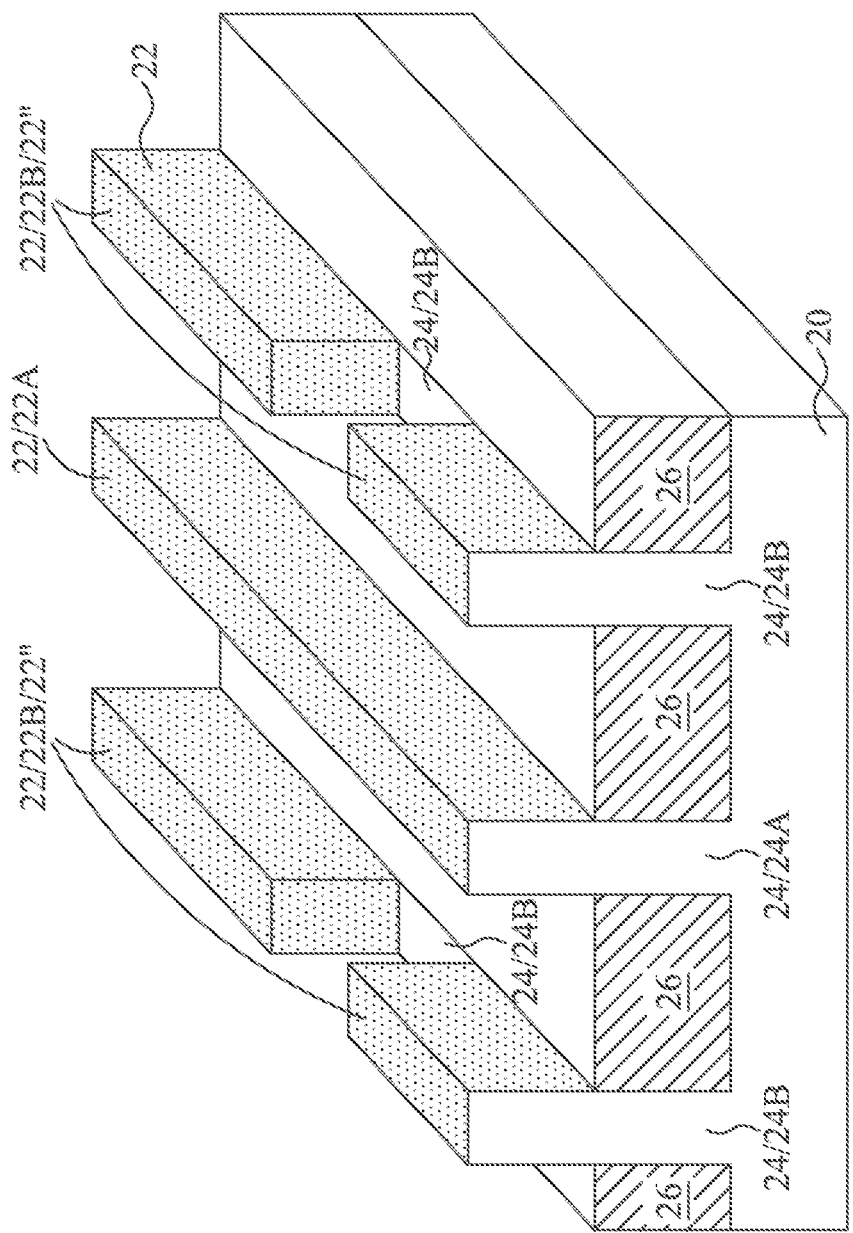

FIG. 2B illustrates a perspective view of the structure after middle portions 22' of semiconductor fins 22B are removed. In some embodiments, after the etching, middle portions 22' are removed substantially fully, and the portions of underlying semiconductor strips 24B underlying middle portions 22' are not removed. After the etching, the exposed top surfaces of the portions of semiconductor strips 24 underlying middle portions 22' are substantially level with the top surfaces of STI regions 26, as illustrated in FIG. 3B. In alternative embodiments, the top surfaces of the portions of semiconductor strips 24B underlying middle portions 22' may be lower than the top surfaces of STI regions 26. After the etching of semiconductor fins 22B, etching mask 30 is removed.

In accordance with some embodiments, a plurality of fins 22 may form a fin group, and fins 22 in the same fin group are close to each other. Referring back to FIG. 1A, the spacings between neighboring fins 22 in the same fin group are referred to as inner-group spacings S1. The spacings between the fin group and other fins 23 that do not belong to the fin group are referred to as inter-group spacings S2. Inner-group spacings S1 may be smaller than inter-group spacings S2. There are two outmost fins that are closest to edges of the fin group, wherein the outmost fins are referred to as edge fins 22B hereinafter. In some embodiments, the two edge fins 22B are etched. The fins between edge fins 22B are referred to as center fins 22A hereinafter. In some embodiments, none of center fins 22A are etched. In alternative embodiments, some of center fins 22A are etched. Edge fins 22B suffer from greater process variations than center fins 22A. In accordance with some embodiments, in the formation of FinFETs, edge fins 22B are not used to form channel regions of the FinFETs, and the center fins 22A may be used to form the channel regions of the FinFETs.

Figure 3A:
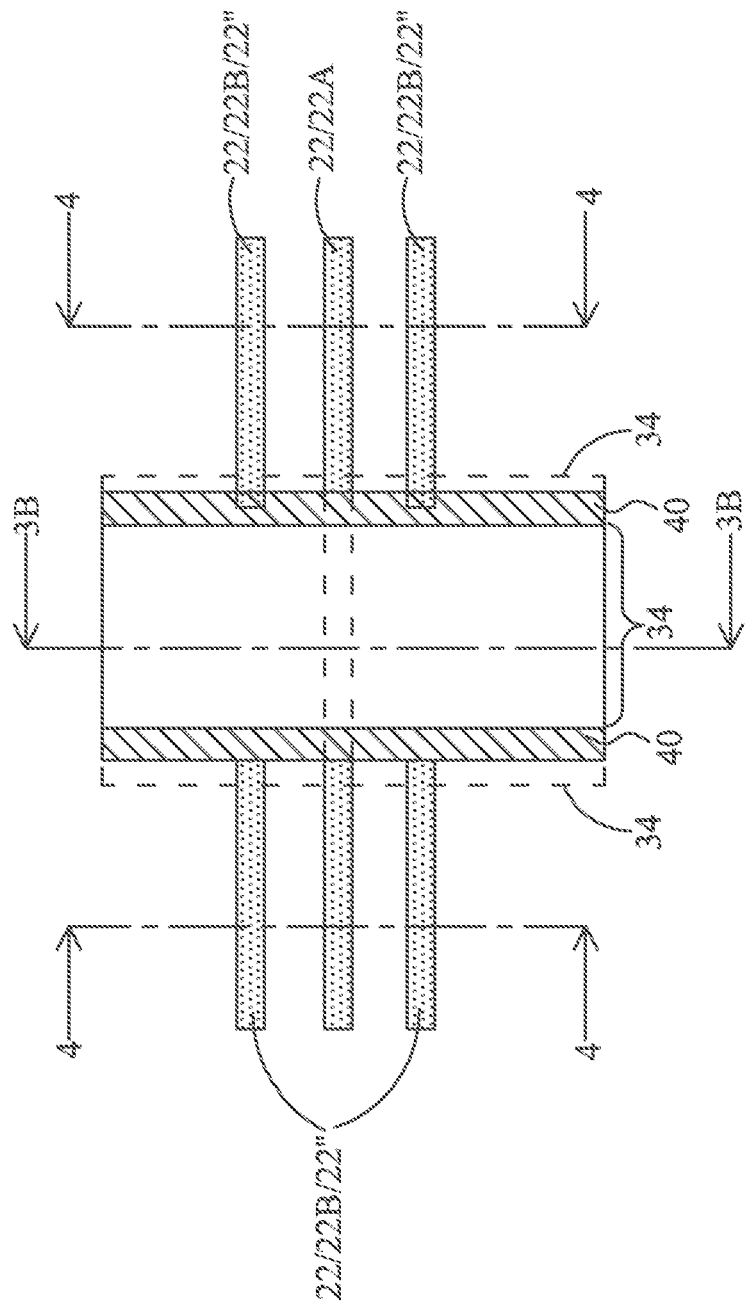
Figure 3B:
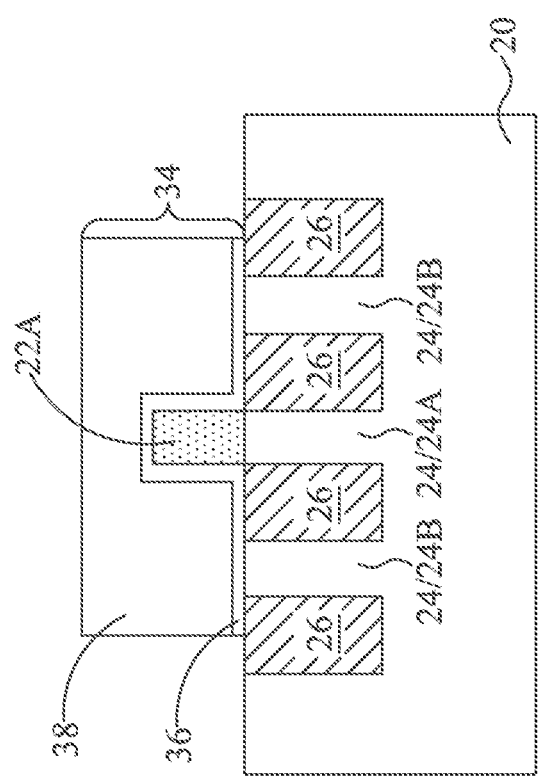

FIG. 3A illustrates a top view of gate stack 34, which is formed to cover the middle portions of semiconductor fins 22A. The opposite end portions of semiconductor fins 22A may not be covered. In addition, at least some, and possibly an entirety, of each of end portions 22" of semiconductor fins 22B are not covered. In some embodiments, as shown using solid lines, gate stack 34 does not cover end portions 22" of semiconductor fins 22B. Alternatively, as shown by the gate stack 34 illustrated using dashed lines, gate stack 34 extends on end portions 22" of semiconductor fins 22B. After the formation of gate stack 34, gate spacers 40 may be formed on the sidewalls of gate stack 34.

FIG. 3B illustrates a cross-sectional view of the structure shown in FIG. 3A, wherein the cross-sectional view is obtained from the plane crossing line 3B-3B in FIG. 3A. As shown in FIG. 3B, gate stack 34 includes gate dielectric 36, which extends on the opposite sidewalls and the top surface of semiconductor fin(s) 22A. Gate dielectric 36 may extend on, and may be in contact with, the top surfaces of semiconductor strips 24B. Furthermore, the interface between gate dielectric 36 and semiconductor strips 24B may be substantially level with the top surface of STI regions 26. Gate dielectric 36 may comprise silicon oxide, silicon nitride, high-k dielectric materials, combinations thereof, and multi-layers thereof. Gate electrode 38 is formed over gate dielectric 36. In some embodiments, gate electrode 38 comprises metals, metal silicides, or other conductive materials. Alternatively, gate electrode 38 may comprise polysilicon. It is appreciated that in the illustrated FIG. 3A, gate stack 34 includes portions over fins 22 and portions on the sidewalls of fins 22. The resulting FinFET may thus be a triple-gate FinFET. In alternative embodiments, gate stack 34 may include portions on the sidewalls of fins 22, and does not include portions over fins 22. The resulting FinFET may thus be a double-gate FinFET. The formation of gate dielectric 36 and gate electrode 38 may comprise forming a blanket gate dielectric layer, forming a blanket gate electrode layer over the blanket gate dielectric layer, and patterning the blanket gate dielectric layer and the blanket gate electrode layer to form gate dielectric 36 and gate electrode 38, respectively.

Figure 10:
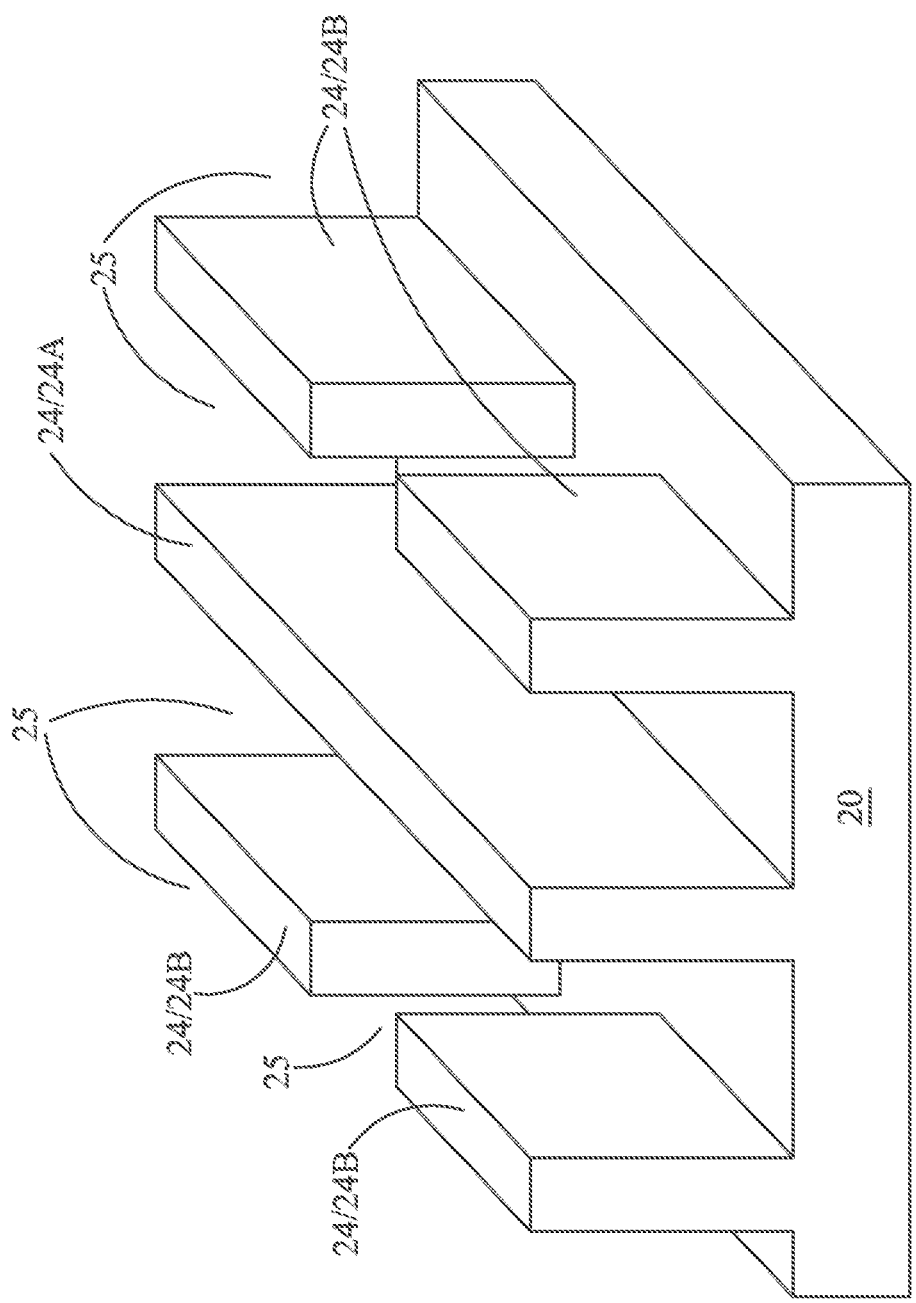
FIGS. 10 through 13 illustrate cross-sectional views in the manufacturing of fins in accordance with some exemplary embodiments.
Figure 11:
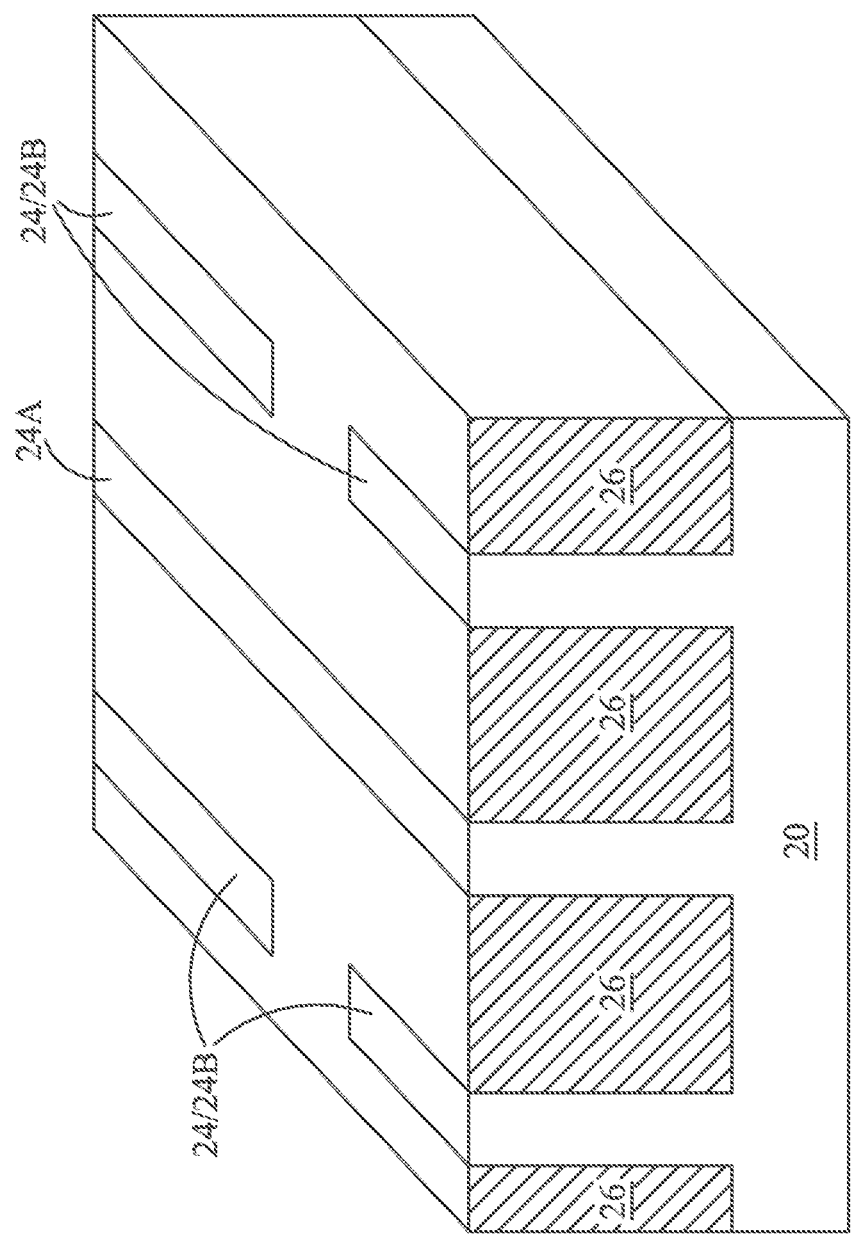
Figure 12:
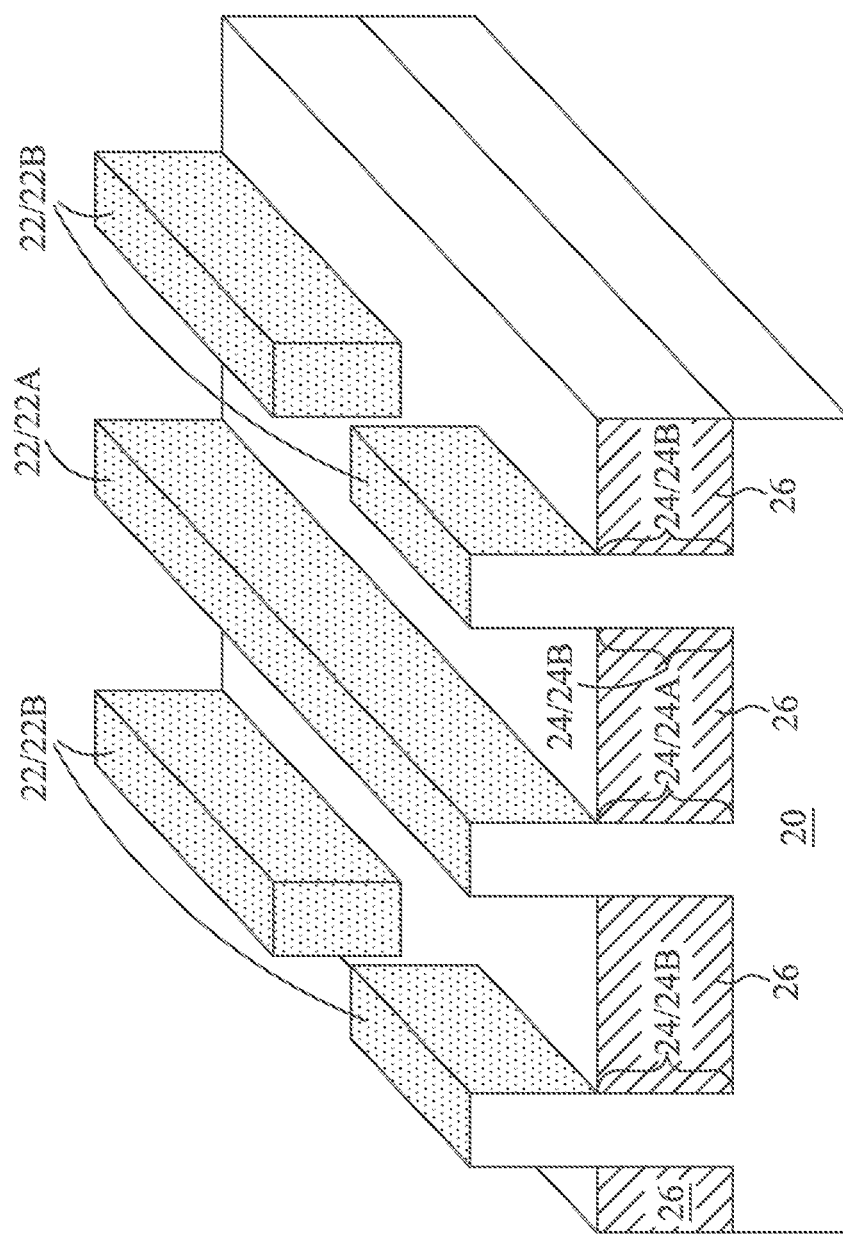
Figure 13:
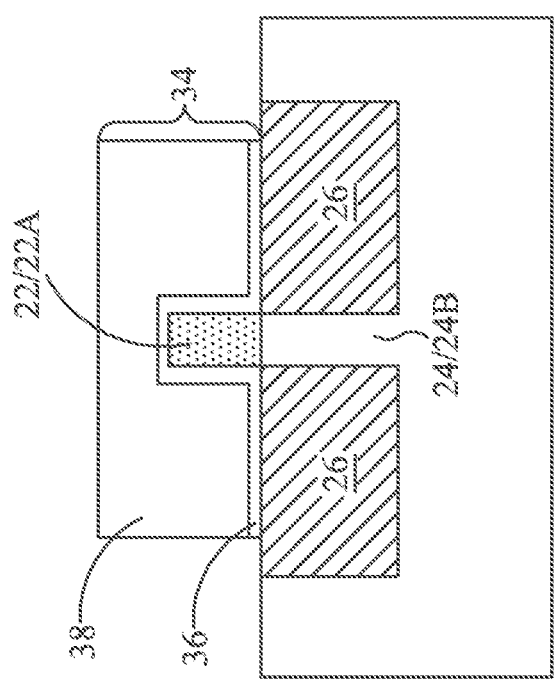

FIGS. 10 through 13 illustrate alternative embodiments for forming a structure similar to the structure shown in FIGS. 2B and 3B. Referring to FIG. 10, a recessing step is performed to form trenches 25 in semiconductor substrate 20. Semiconductor strips 24A and 24B are thus formed. Two semiconductor strips 24B that are aligned to a straight line are separated from each other by one of trenches 25. Next, referring to FIG. 11, STI regions 26 are formed in trenches 25. The top surfaces of STI regions 26 are level with the top surfaces of semiconductor strips 24A and 24B. FIG. 12 illustrates the recessing of STI regions 26, wherein portions of semiconductor strips 24A and 24B over the top surfaces of STI regions 26 form semiconductor fins 22A and 22B, respectively. It is noted that in the structure shown in FIG. 12, each pair of semiconductor strips 24B that is aligned to a straight line is separated from each other by a portion of STI regions 26. FIG. 13 illustrates a cross-sectional view of the structure after the formation of gate stack 34. FIG. 13 is obtained from the plane crossing line 3B/3B in FIG. 3A.

Figure 5A:
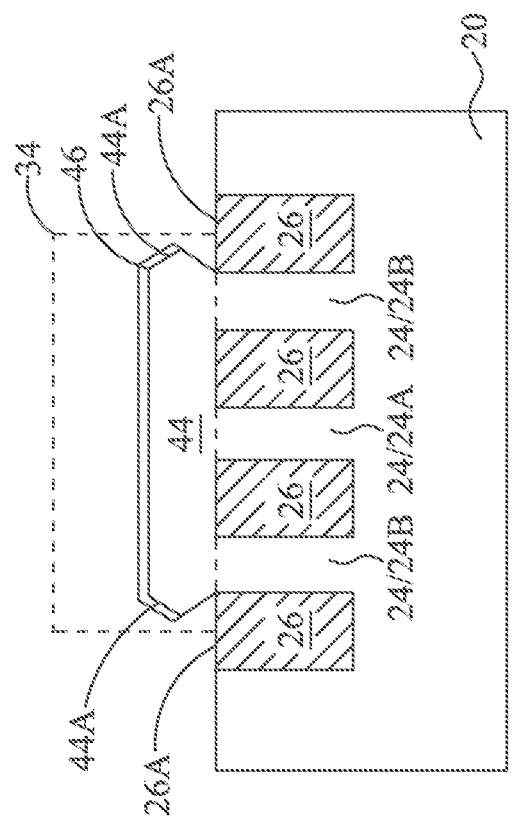

FIGS. 4, 5A, and 5B illustrate the formation of source and drain regions (referred to as source/drain regions hereinafter) 44 (FIG. 5A) and source and drain silicide regions (referred to as source/drain silicide regions hereinafter) 46. The cross-sectional views in FIGS. 4 and 5A are obtained from the same plane crossing lines 4-4 in FIG. 3A. In FIGS. 4 and 5A, gate stack 34 is illustrated using dashed lines since it is not in the planes of FIGS. 4 and 5A. Referring to FIG. 4, the portions of semiconductor fins 22A and 22B (FIG. 3A) not covered by gate stack 34 and gate spacers 40 are recessed. The spaces left by the etched portions of fins 22A and 22B are referred to as recesses 41 hereinafter. Lines 43 illustrate some exemplary positions of the top surfaces of semiconductor fins 22 or semiconductor strips 24 after the recessing. In some embodiments, substantially all exposed portions of semiconductor fins 22A and 22B are etched, and semiconductor strips 24A and 24B are not recessed. In alternative embodiments, the upper portions of the exposed portions of semiconductor fins 22A and 22B are etched, and the lower portions of semiconductor fins 22A and 22B remain not etched. In yet other embodiments, all exposed portions of semiconductor fins 22A and 22B are etched, and the top portions of semiconductor strips 24A and 24B are also recessed, so that the resulting recesses 41 extend to below top surfaces 26A of STI regions 26.

As shown in FIG. 5A, an epitaxy is performed to epitaxially grow epitaxy region 44, for example, using Selective Epitaxy Growth (SEG), wherein epitaxy region 44 is selectively grown from the exposed surfaces of semiconductor strips 24 or the remaining portions of semiconductor fins 22A and 22B, if any. The epitaxy material grown from neighboring semiconductor strips 24 or semiconductor fins 22 may merge with each other to from a continuous epitaxy region 44. As a result, the resulting epitaxy region 44 extends to over and aligned to semiconductor strips 24A and 24B. Epitaxy region 44 may comprise silicon germanium, silicon carbon, silicon with no germanium and carbon added therein, or other semiconductor materials. Epitaxy region 44 may have facets 44A that are neither parallel to nor perpendicular to top surfaces 26A of STI regions 26. After the epitaxy to form epitaxy region 44, a source/drain implantation may be performed to form a source/drain region, which is also denoted as 44. Source/drain silicide region 46 may then be formed on source/drain region 44.

FIG. 5B illustrates a top view of the structure shown in FIG. 5A; it is observed that epitaxy source/drain regions 44 may expand to over semiconductor fins 22A and semiconductor fins 22B. Further, epitaxy source/drain regions 44 are formed on opposite ends of semiconductor fins 22A. Since semiconductor fins 22B were etched in the step shown in FIGS. 2A and 2B, there are no semiconductor fins 22B left under gate stack 34. Accordingly, the source-to-drain current of the respective FinFET needs to flow through the remaining semiconductor fins 22A, which form the channel regions of the resulting FinFET.

FIGS. 6A through 9B illustrate the formation of FinFETs in accordance with alternative embodiments. Unless specified otherwise, the materials and formation methods of the components in these embodiments are essentially the same as the like components, which are denoted by like reference numerals in the embodiment shown in FIGS. 1A through 5B. The formation details of the embodiments shown in FIGS. 6A through 9B may thus be found in the discussion of the embodiment shown in FIGS. 1A through 5B.

Figure 6B:
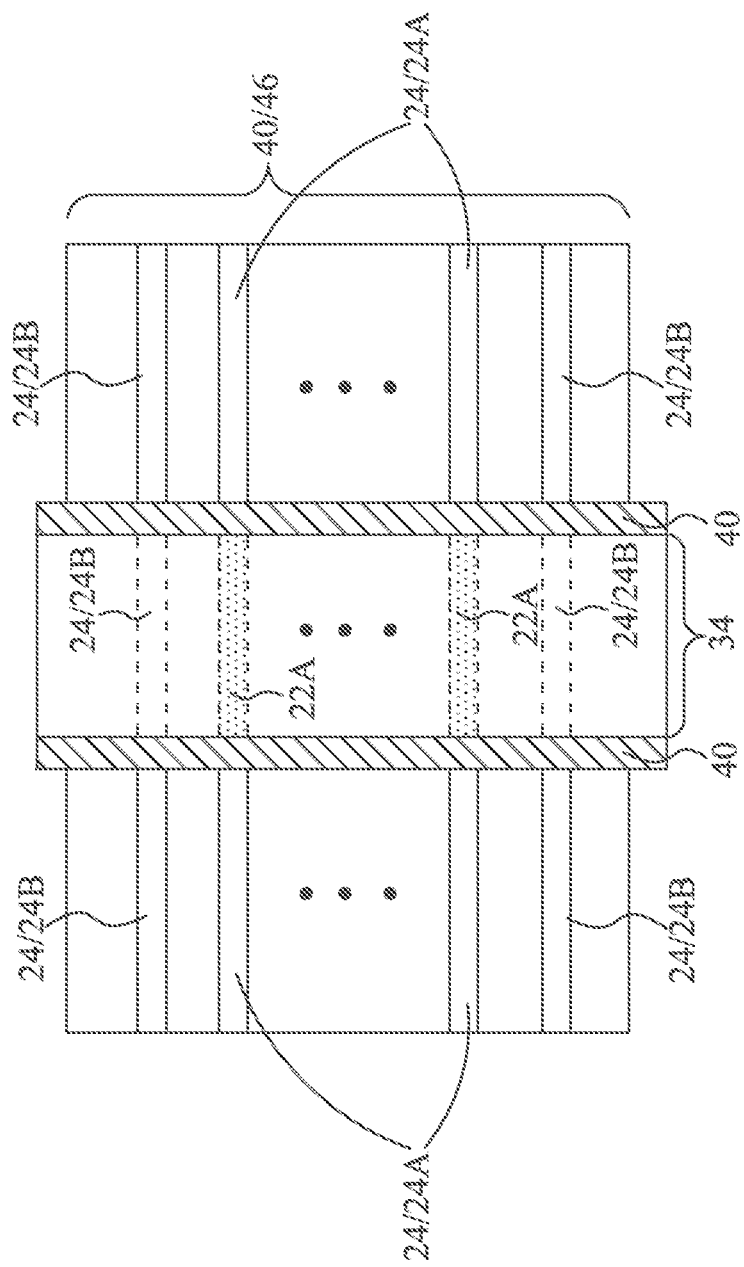
FIGS. 6A through 9B are cross-sectional views and top views of intermediate stages in the manufacturing of FinFETs in accordance with alternative embodiments.

Referring to FIG. 6A, a plurality of center fins 22A is parallel to each other and neighboring each other. Center fins 22A are between two edge fins 22B. Semiconductor strips 24A and 24B are under semiconductor fins 22A and 22B, respectively. The total count of center fins 22A may be equal to any integer greater than 1. In a step similar to the step shown in FIGS. 2A and 2B, the middle portions of edge fins 22B are etched, so that the opposite end portions of each of edge fins 22B are disconnected from each other. At least some, and possibly all, of center fins 22A are not etched. In subsequent process steps (which are similar to the steps shown in FIGS. 3A through 5B), as shown in FIG. 6B, gate stack 34 and gate spacers 40 are formed, followed by the epitaxy source/drain regions 44 and source/drain silicide regions 46.

Figure 7:
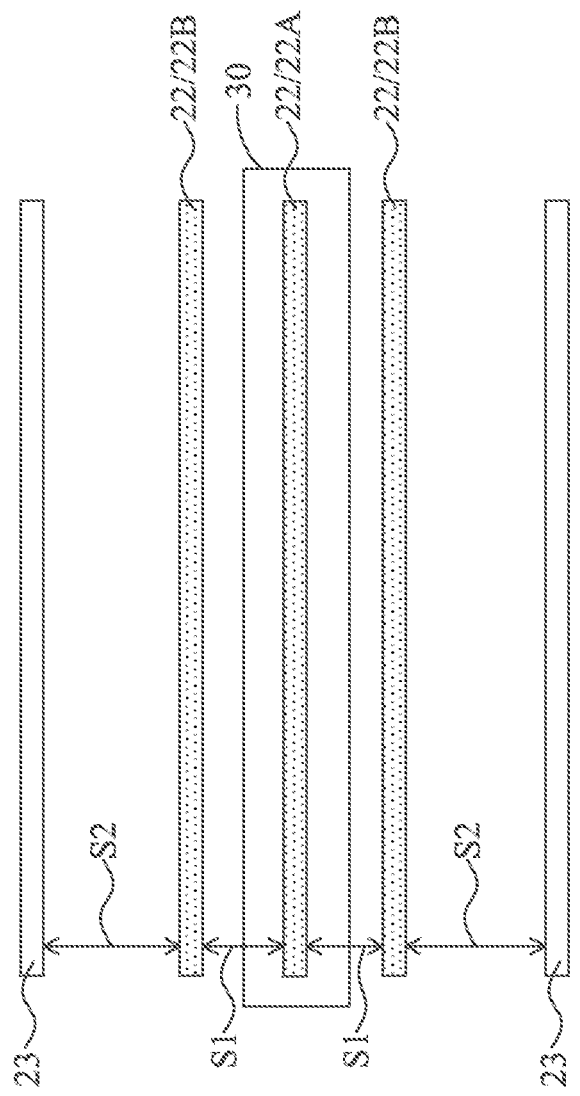

FIGS. 7 through 9B illustrate the top views and cross-sectional views of intermediate stages in the manufacturing of a FinFET in accordance with alternative embodiments. These embodiments are similar to the embodiments in FIGS. 1A through 5B, except that in the epitaxy step for forming epitaxy regions, the epitaxy regions are not grown from semiconductor strips 24B. Referring to FIG. 7, a fin group includes a plurality of fins 22, which includes edge fins 22B and center fin(s) 22A. Again, inner-group spacings S1 of fins 22 may be smaller than inter-group spacings S2, which are the spacings between edge fins 22B and fins 23 that do not belong to the fin group. An etching mask such as photo resist 30 is formed and patterned. Edge fins 22B are not covered by photo resist 30, and center fins 22A are covered. Although FIG. 7 illustrates a single center fin 22A, there may be any integer number of semiconductor fins 22A between edge fins 22B. Etching mask 30 is then used to remove edge fins 22B, wherein the entireties of edge fins 22B are etched and removed. In the resulting structure, the top surfaces of semiconductor strips 24B (please refer to FIG. 8B) may be substantially level with top surfaces 26A of STI regions 26.

Figure 8B:
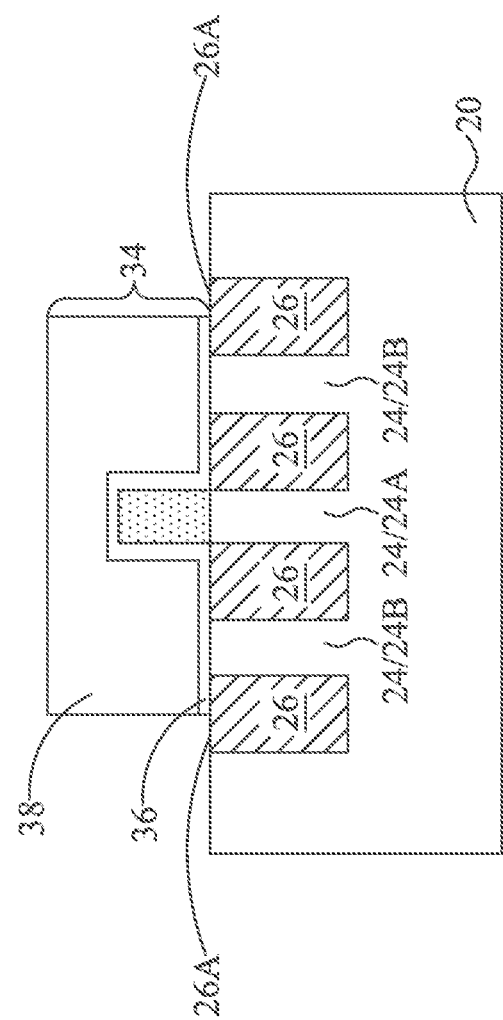
Figure 9A:
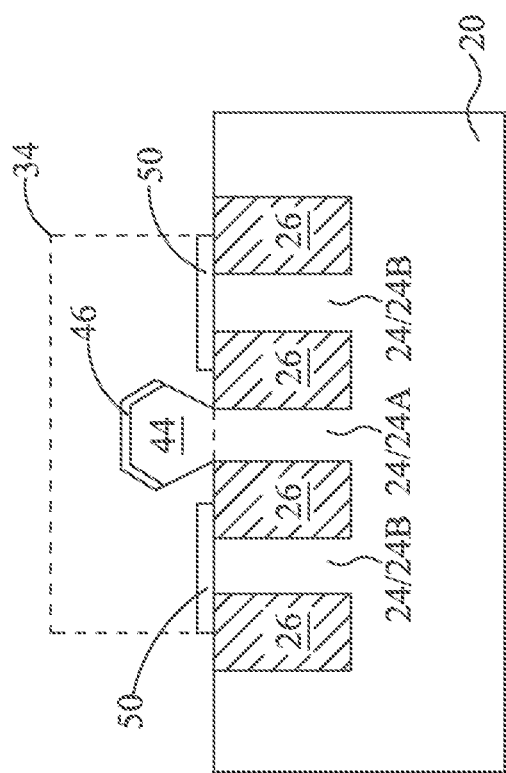

FIGS. 8A and 8B are a top view and a cross-sectional view, respectively, of the formation of gate stack 34 and gate spacers 40. Gate stack 34 may be formed on the top surface and sidewalls of semiconductor fin 22A. Further, gate stack 34 may, or may not, extend on semiconductor strips 24B. Next, as shown in FIG. 9A, semiconductor fins 22A may be recessed, for example, in an etching step. Epitaxy region(s) 44 are then epitaxially grown from semiconductor fins 22A or semiconductor strips 24A. In some embodiments, mask layer 50 is formed to cover semiconductor strips 24B. Accordingly, since the epitaxy is selective, epitaxy region(s) 44 are not grown from semiconductor strips 24B. Mask layer 50 may be formed of a dielectric material such as silicon oxide, silicon nitride, or the like. FIG. 9B illustrates a top view of the FinFET in FIG. 9A.

In the embodiments, the edge fins are etched, and the center fins between the edge fins may, or may not, be etched. Due to the etching of the edge fins, the edge fins no long form the channel regions of the respective FinFETs. Since the edge fins have greater process variations than the center fins, the etching of the edge fins result in the desirable reduction in the variation of the saturation currents of the FinFETs.

In accordance with embodiments, a method includes providing a structure, which includes a semiconductor substrate, isolation regions at a surface of the semiconductor substrate, a plurality of semiconductor strips between the isolation regions, and a plurality of semiconductor fins over and aligned to respective ones of the plurality of semiconductor strips. The plurality of semiconductor fins is parallel to each other, and includes two edge fins and a center fin between the two edge fins. A middle portion of each of the two edge fins is etched. A gate dielectric is formed on sidewalls of a middle portion of the center fin. A gate electrode is formed over the gate dielectric. An epitaxy is performed to form an epitaxy region, wherein the epitaxy region extends to over two of the plurality of semiconductor strips underlying the two edge fins, and extends to over one of the plurality of semiconductor strips under the center fin. A source/drain region is formed in the epitaxy region.

In accordance with other embodiments, a method includes providing a plurality of semiconductor fins parallel to each other, and includes two edge fins and a center fin between the two edge fins. A middle portion of each of the two edge fins is etched, and the center fin is not etched. A gate dielectric is formed on a top surface and sidewalls of the center fin. A gate electrode is formed over the gate dielectric. The end portions of the two edge fins and end portions of the center fin are recessed. An epitaxy is performed to form an epitaxy region, wherein an epitaxy material grown from spaces left by the end portions of the two edge fins are merged with an epitaxy material grown from a space left by the end portions of the center fin to form the epitaxy region. A source/drain region is formed in the epitaxy region.

In accordance with yet other embodiments, a device includes a semiconductor substrate, isolation regions at a surface of the semiconductor substrate, and a plurality of semiconductor strips including a first, a second, and a third semiconductor strip between the isolation regions and parallel to each other. The second semiconductor strip is between the first and the third semiconductor strips. A semiconductor fin is over and joined to the second semiconductor strip. A gate dielectric is on sidewalls of the first semiconductor fin. Bottom surfaces of the portions of the gate dielectric over and aligned to the first and the third semiconductor strips are substantially level with a top surface of the isolation regions. A gate electrode is over the gate dielectric, wherein the gate dielectric and the gate electrode form portions of a FinFET. A source/drain region is over and aligned to the first, the second, and the third semiconductor strips.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a semiconductor substrate;
   isolation regions at a surface of the semiconductor substrate;
   a plurality of semiconductor strips comprising a first, a second, and a third semiconductor strip between the isolation regions and parallel to each other, wherein the second semiconductor strip is between the first and the third semiconductor strips;
   a first semiconductor fin over and joined to the second semiconductor strip;
   a gate dielectric on sidewalls of the first semiconductor fin, wherein the gate dielectric is directly on the first and the third semiconductor strips and the gate dielectric bottom surface is substantially level with a top surface of the isolation regions as the gate dielectric crosses over the first and third semiconductor strips;
   a gate electrode over the gate dielectric, wherein the gate dielectric and the gate electrode form portions of a Fin Field-Effect Transistor (FinFET); and
   a source/drain region aligned with and extending continuously over the first, the second, and the third semiconductor strips.

2. The device of claim 1, wherein the plurality of semiconductor strips has first spacings between neighboring ones of the plurality of semiconductor strips, and wherein the first and the third semiconductor strips have second spacings from additional semiconductor strips outside of the plurality of semiconductor strips, and wherein the second spacings are greater than the first spacings.

3. The device of claim 1, wherein the source/drain region comprises facets that are neither parallel nor perpendicular to a top surface of the isolation region.

4. The device of claim 1, further comprising:
   a fourth semiconductor strip between the isolation regions and parallel to the first semiconductor strip, wherein the fourth semiconductor strip is between the first and the third semiconductor strips; and
   a second semiconductor fin over and adjoining the fourth semiconductor strip, wherein the gate dielectric extends on a top surface and sidewalls the second semiconductor fin, and wherein the source/drain region extends to over and aligned to the fourth semiconductor strip.

5. The device of claim 1, wherein the isolation regions comprise edges in contact with respective edges of the first, the second, and the third semiconductor strips.

6. The device of claim 1, wherein all semiconductor strips between the first and the third semiconductor strips comprise overlying semiconductor fins that form channel regions of the FinFET.

7. The device of claim 1, wherein the semiconductor substrate and the first semiconductor fin are formed of a same semiconductor material.

8. A device, comprising:
   isolation regions at a surface of a semiconductor substrate;
   a plurality of semiconductor fins disposed over the semiconductor substrate, wherein each of the plurality of semiconductor fins are parallel to other ones of the plurality of semiconductor fins, at least one center fin of the plurality of semiconductor fins disposed between at least two edge fins of the plurality of fins, and wherein a first edge fin includes a first end portion and a second end portion physically disconnected from the first end portion and a second edge fin includes a third end portion and a fourth end portion physically disconnected from the third end portion;
   a gate stack on a top surface and sidewalls of the at least one center fin; and
   source/drain regions each extending over an end portion of the at least one center fin and each extending to over end portions of the least two edge fins.

9. The device of claim 8, wherein each of the source/drain regions are epitaxy regions.

10. The device of claim 8, wherein the gate stack extends between the end portions of at least one of the at least two edge fins.

11. The device of claim 8, wherein the plurality of semiconductor fins are disposed between the isolation regions.

12. The device of claim 11, wherein the source/drain regions each comprise facets that are neither parallel nor perpendicular to top surfaces of the isolation regions.

13. The device of claim 11, wherein a portion of the isolation regions extends between the end portions of each of the at least two edge fins.

14. The device of claim 8, wherein the gate stack and source/drain regions each form a portion of a Fin Field-Effect Transistor (FinFET);
   wherein a middle portion of the at least one center fin forms a channel region of the FinFET; and
   wherein the edge fins are substantially free of channel regions.

15. A device comprising:
   isolation regions at a surface of a semiconductor substrate;
   a plurality of semiconductor strips disposed on the semiconductor substrate, wherein each semiconductor strip of the plurality of semiconductor strips is parallel to each other strip of the plurality of semiconductor strips, and wherein the plurality of semiconductor strips comprises at least one center strip between at least two edge strips and wherein at least center portions of the at least two edge strips are substantially free of an overlying semiconductor fin; and
   at least one semiconductor fin over and aligned to a respective one of the at least one center strip;
   a gate dielectric on sidewalls of the at least one semiconductor fin;
   a gate electrode over the gate dielectric;
   a source region over first end portions of the at least two edge strips, and extending to over a first end portion of the at least one center strip; and
   a drain region over second end portions of the at least two edge strips, and extending to over a second end portion of the at least one center strip.

16. The device of claim 15, wherein the plurality of semiconductor strips are disposed between the isolation regions.

17. The device of claim 16, wherein top surfaces of the two of the plurality of semiconductor strips are substantially level with top surfaces of the isolation regions.

18. The device of claim 15, wherein the gate dielectric extends between the first end portion and second end portion of at least one of the at least two edge strips.

19. The device of claim 15, wherein the plurality of semiconductor strips comprises two or more center strips disposed between two edge strips, a first edge strip disposed at a first side of the two more center strips and a second edge strip disposed at a second side; and
   wherein the source region extends continuously over the first end portions of first and second edge strip, and extending over the first end portions of the two or more center strips.

* * * * *